(12) United States Patent
Woo

(10) Patent No.: US 8,284,108 B2
(45) Date of Patent: Oct. 9, 2012

(54) METHOD OF MEASURING RADIATION CHARACTERISTIC OF ANTENNA

(75) Inventor: Jong-Myung Woo, Daejeon (KR)

(73) Assignee: The Industry & Academic Cooperation In Chungnam National University, Daejeon (KR)

( * ) Notice: Subject to any disclaimer, the term of this patent is extended or adjusted under 35 U.S.C. 154(b) by 337 days.

(21) Appl. No.: 12/568,732

(22) Filed: Sep. 29, 2009

(65) Prior Publication Data

US 2010/0164815 A1 Jul. 1, 2010

(30) Foreign Application Priority Data

Dec. 31, 2008 (KR) .......................... 10-2008-0138180

(51) Int. Cl.
*G01R 29/10* (2006.01)
(52) U.S. Cl. ........................................ 343/703
(58) Field of Classification Search .................. 343/703, 343/701, 700 MS, 718; 342/109
See application file for complete search history.

(56) References Cited

U.S. PATENT DOCUMENTS

| 5,574,466 | A   | * | 11/1996 | Reed et al. ...................... 342/359 |
| 7,006,038 | B2  | * | 2/2006  | Smith ........................... 342/360 |
| 7,280,078 | B2  | * | 10/2007 | Salsman et al. ................ 343/703 |
| 2003/0197642 | A1 | * | 10/2003 | Smith ........................... 342/360 |
| 2008/0129615 | A1 | * | 6/2008  | Breit et al. ..................... 343/703 |
| 2010/0153045 | A1 | * | 6/2010  | Teshirogi et al. ............... 702/76 |

FOREIGN PATENT DOCUMENTS

| KR | 10-0543725 | 6/2004 |
| KR | 10-0692920 | 3/2007 |

* cited by examiner

*Primary Examiner* — Huedung Mancuso
(74) *Attorney, Agent, or Firm* — Lexyoume IP Meister, PLLC.

(57) ABSTRACT

Disclosed is a method of measuring the radiation characteristic of an antenna, where sufficient power is secured within a short period of time and supplied in a stable manner so as to always keep the intensity of measurement signals high irrespective of the measurement frequency. With the antenna radiation measurement method, upon receipt of measurement frequency signals, location information and measured values are processed to transmit measurement signals, and a charging high frequency of several hundred megahertz (MHz) to several hundred gigahertz (GHz) is scanned toward a tester body such that inductive power is generated to allow the self-charging. The measurement frequency signals are transmitted toward the tester body through a source antenna, and the measured signals transmitted from the measurement antennas of the respective measurement modules are received and data-processed at a measurement controller.

1 Claim, 5 Drawing Sheets

METHOD OF MEASURING RADIATION CHARACTERISTIC OF ANTENNA

CROSS-REFERENCE TO RELATED APPLICATION

This application claims priority to and the benefit of Korean Patent Application No. 10-2008-0138180 filed in the Korean Intellectual Property Office on Dec. 31, 2008, the entire contents of which are incorporated herein by reference.

BACKGROUND OF THE INVENTION (a) Field of the Invention

The present invention relates to a method of measuring the radiation characteristic of an antenna, and more particularly, to an antenna radiation measurement method that scans a charging frequency and a measurement frequency in a separate manner so as to significantly enhance the intensity of measured signals.

(b) Description of the Related Art

Generally, among the antenna ranges that are used to measure the radiation characteristic (the phase, the intensity, or the amplitude) of an antenna, there are a far-field range where the measurement is made while the source antenna is placed far from the tester or receiver antenna, a near-field range where the measurement is made by using the source antenna as a transmitter and taking samples near the source antenna with a probe at a predetermined distance, and a compact range where the measurement is made while the source antenna is placed near a reflector antenna being the tester antenna.

The far-field ranges are further classified into an elevated range where the measurement is made while the source antenna and the tester antenna are installed at a tower, a building, or the top of a hill, a slant range where the measurement is made while one of the source and the tester antennas is placed at a high position and the other on the ground, and an anechoic chamber where the measurement is made in a room having surfaces with absorbent materials for removing possible reflection. The elevated range and the slant range involve lower installation and measurement costs, but practically require a very wide area and a high tower, with the disadvantage of being significantly influenced by weather. The anechoic chamber involves indoor measurement and is not influenced by weather, but has the disadvantage that much cost is needed to make a large laboratory (for example, making it with a vertical length of 10 m, a horizontal length of 10 m and a height of 5 m) with absorbent materials.

With the case of the elevated range or the slant range, the distance between the source and tester antennas is large. Further, when various objects such as trees, forests, hills, rivers, and buildings exist between the source antenna and the tester antenna, it is very difficult to make correct measurements and to quickly cope with variable measurement situations. Consequently, the measured values are largely differentiated due to the temperature differences and the weather. Moreover, with the case of the far-field range, the source antenna is exposed to the outside to correctly obtain the measured values, and hence, it becomes difficult for radar or military antennas to make the desired measurement with stealth.

The compact range is desirably installed within a relatively small space, but it undesirably requires a large-scale reflector.

With the compact range, the measurement may be made in a very small space provided that the inter-distance of minimally 1 wavelength is made to the source antenna. However, as the probe should precisely move in the X and Y axial directions to correctly configure a predetermined plane (the plane perpendicular to the central axis of the source antenna) within the short distance, much cost and time are consumed to provide the equipment for moving the probe (the tester antenna), and to make the desired measurement.

The anechoic chamber also involves the same problem as with the near-field range in that the measurement is made using a probe.

That is, with the case of the near-field range and the anechoic chamber, as the data measured at the probe are converted into far-field range data, the correct data can be obtained only when the probe moves very precisely. The precision degree in the movement of the probe reaches several micrometers (μm) to several tens of micrometers (μm). As the carrier for moving the probe very precisely is very expensive at up to hundreds of millions of won, it is practically difficult for small companies to conduct measurement experiments related to the development of antennas in a sufficient manner.

As the measurement is made while moving the probe minutely, several hours are consumed even to make the measurement once, and this means that considerable time is needed to complete the required measurements. Furthermore, as the possibility of making errors in the measuring is high due to variable environmental conditions, total inspection with respect to the produced antennas becomes impossible, and only sampling tests can be performed.

In order to obtain more accurate far-field range data, it is required to enlarge the mobile range (the plane area) of the probe, but such enlargement is practically restricted due to the limit of the carrier for moving the probe.

Furthermore, the carrier for moving the probe is liable to generate electromagnetic waves, which are applied to the measured values as noise.

Furthermore, with the case of the near-field range and the anechoic chamber, as the measurement is made only with respect to the front side of the source antenna, it is impossible to make correct expressions for a back lobe. In order to correctly express the back lobe, it is necessary to reverse the direction the source antenna and make the measurement again, and this involves doubling the measurement time.

Korean Patent No. 10-0543725 discloses a system and a method for measuring the radiation characteristic of an antenna that measures the radiation characteristic of a source antenna within a short period of time by using an ultra-mini measurement antenna and IC chips.

It is possible to measure the radiation characteristic of an antenna in real time with the Patent No. 10-0543725 as the measurement values for the entire area of a tester body are obtained simultaneously with the operation of the source antenna.

Furthermore, with the Patent No. 10-0543725, the cost reduction effect is very great, and the measurement is made without making errors due to weather or temperature variations, compared with the probe technique.

However, with the case of the Patent No. 10-0543725, as the frequency signals received by the measurement module to make the measurement is used as driving power, it may be difficult to obtain desired driving power when the measurement frequency signals are low in level. Accordingly, the measured signals transmitted from the measurement modules are weak, and a degree of amplification of several times should be conducted in order to receive and process the measured signals. Furthermore, signal distortion may occur during the amplification process.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a method of measuring the radiation characteristic of an antenna as an improvement of the Korean Patent No. 10-0543725 having advantages of always maintaining the intensity of measurement signals to be high irrespective of the level of the measurement frequency, as sufficient power is secured within a short period of time by using a charging high frequency and is supplied in a stable manner by installing a storage battery within a measurement module.

An exemplary embodiment of the present invention provides a method of measuring the radiation characteristic of an antenna. With the antenna radiation measurement method, upon receipt of measurement frequency signals, location information and measured values are processed so as to transmit measurement signals, and a charging high frequency of several hundred megahertz (MHz) to several hundred gigahertz (GHz) is scanned toward a tester body such that inductive power is generated for self-charging. The measurement frequency signals are transmitted toward the tester body through a source antenna, and the measured signals transmitted from the measurement antennas of the respective measurement modules are received and data-processed at a measurement controller.

With the antenna radiation measurement method, sufficient power is secured within a short period of time by charging a storage battery with a power based on a high frequency, and signals are stably and reliably measured with sufficient intensity even when the measurement is made with relatively low-level frequency signals.

DETAILED DESCRIPTION OF THE EMBODIMENTS

The present invention will be described more fully hereinafter with reference to the accompanying drawings, in which exemplary embodiments of the invention are shown.

Figure 2:
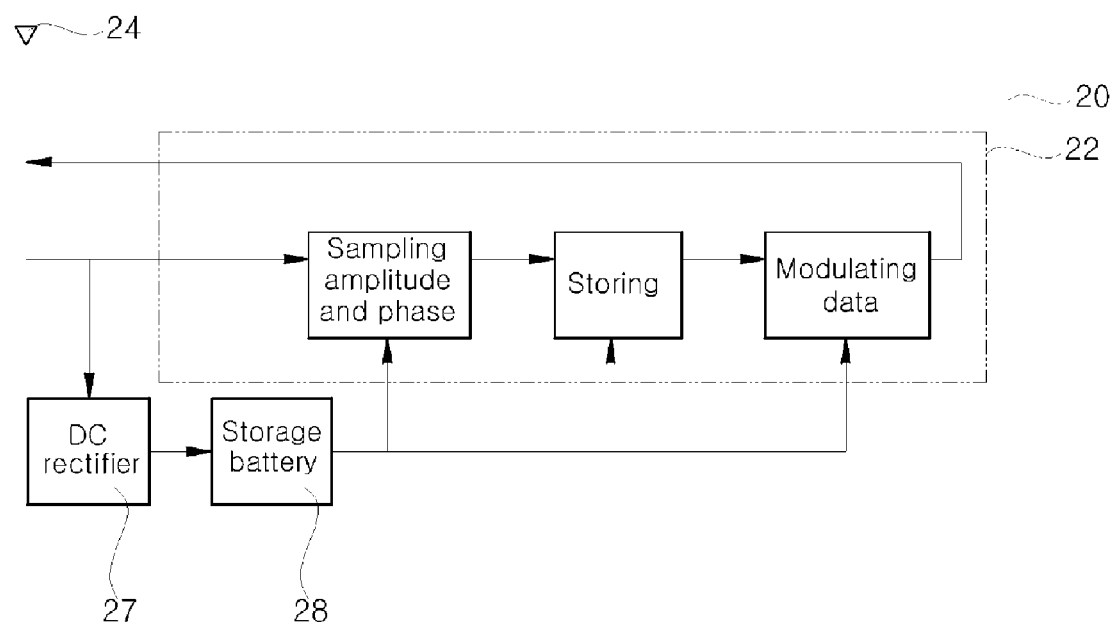
FIG. 2 is a functional block diagram of a measurement module used in an antenna radiation measurement method according to an exemplary embodiment of the present invention.
Figure 3:
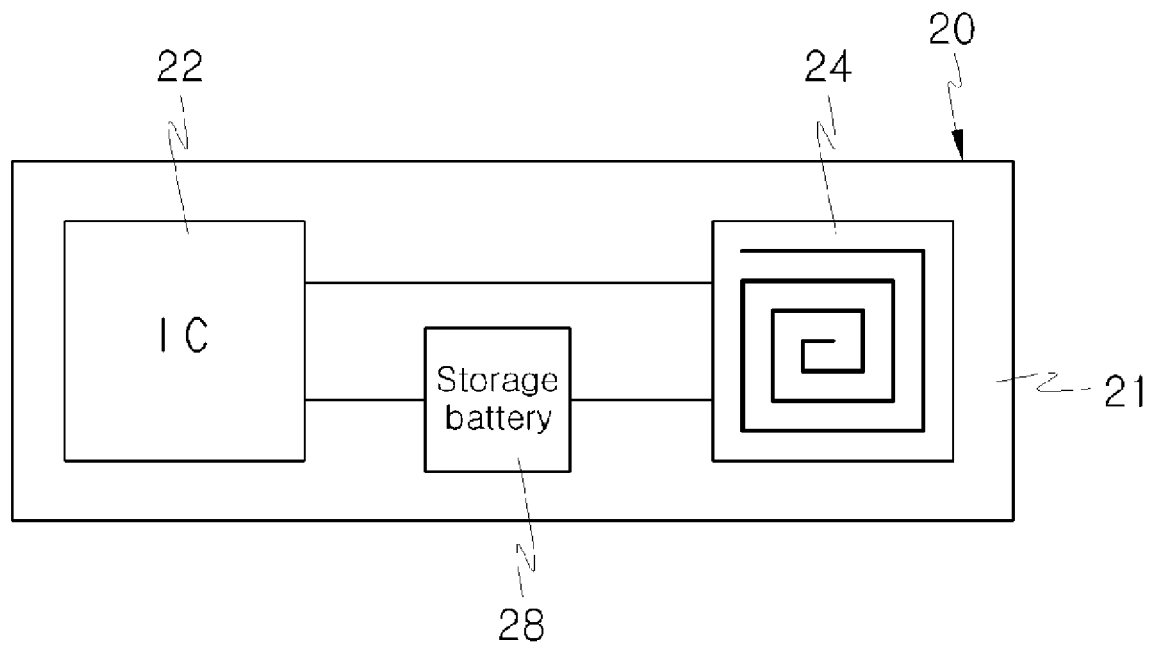
FIG. 3 is a schematic block diagram of a measurement module used in an antenna radiation measurement method according to an exemplary embodiment of the present invention.
Figure 4:
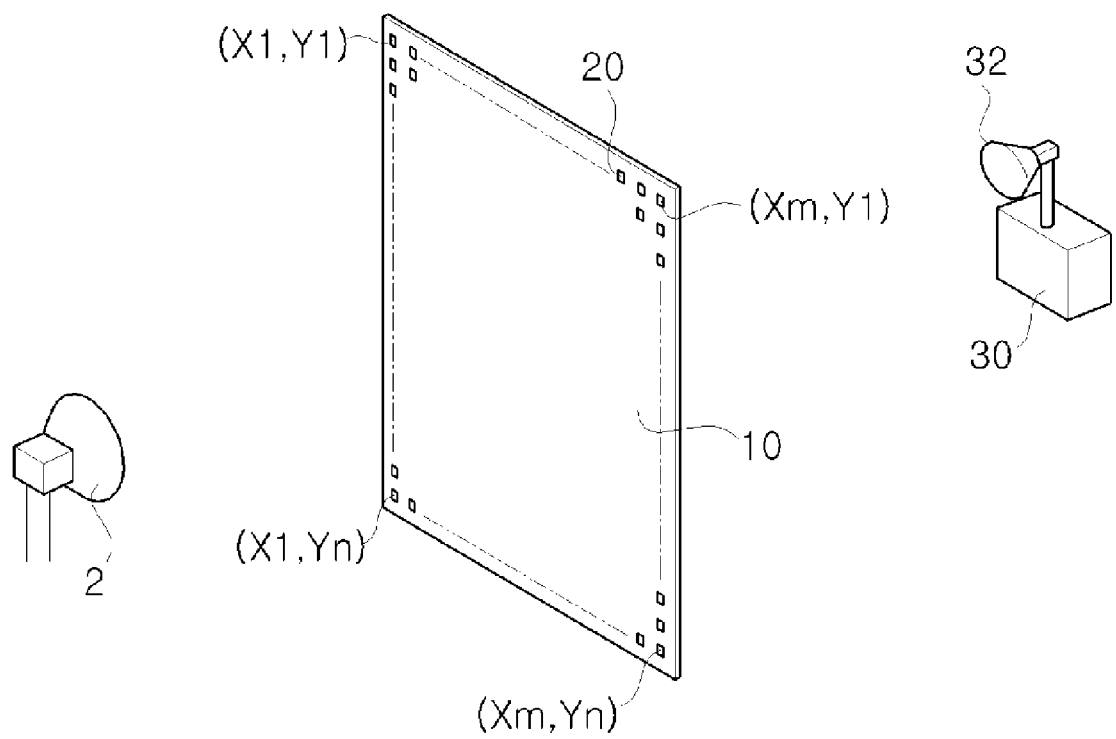
FIG. 4 is a perspective view of an antenna radiation measurement system used in an antenna radiation measurement method according to an exemplary embodiment of the present invention.

As shown in FIG. 2 to FIG. 4, a system of measuring the radiation characteristic of an antenna according to an exemplary embodiment of the present invention includes a plurality of measurement modules 20 arranged at a tester body 10, a source antenna 2 placed apart from the tester body 10 by a predetermined distance, and a measurement controller 30 receiving the measured signals transmitted from the respective measurement modules 20 to process the data.

The measurement modules 20 are arranged at the tester body 10 in a predetermined pattern.

The measurement modules 20 each have an IC chip 22 for processing the positional information and the measured values so as to generate signals, a tester antenna 24 for receiving and transmitting the signals from the IC chip 22, and a storage battery 28 charged by the inductive power generated from the tester antenna 24. Upon receipt of the frequency signals from the source antenna 2, the tester antenna 24 generates inductive power for driving the IC chip 22 and transmits the measured values for the frequency signals to the IC chip 22.

The measurement controller 30 receives the signals from the tester antennas 24 of the measurement modules 20, and processes the location information and the measured values of the respective measurement modules 20.

A receiver antenna 32 is installed at the measurement controller 30 to receive the signals from the tester antenna 24. With the measurement controller 30, built-in software converts the measured values into far-field range data.

The tester body 10 is formed with a plane shape by using a material that does not significantly scatter or reflect the frequency signals from the source antenna 2.

It is described with the above antenna radiation measurement system that the tester body 10 has a plane shape, but the tester body 10 may be formed with various other shapes, such as like a circular arc with a predetermined curvature, a semicircle, a cone, a quadrangular pyramid, or a horn.

As shown in FIG. 2 and FIG. 3, the measurement module 20 is formed through attaching an IC chip 22, a measurement antenna 24, and a storage battery 28 to a substrate 21 by way of a surface mounting technique.

The substrate 21 may be formed in the shape of a quadrangle with a length of about 2-4 mm, or a circle or oval with a maximum diameter of about 2-4 mm.

The substrate 21 may be further provided with a DC rectifier 27 for rectifying frequency signals received through the measurement antenna 24 such that the current that is rectified through the DC rectifier 27 is charged to the storage battery 28.

Alternatively, the IC chip 22, the measurement antenna 24, the DC rectifier 27, and the storage battery 28 may be directly formed on the substrate 21 by way of printing or photolithography.

The IC chip 22 stores a number that is unique to the installation location. It is possible to use a coordinate value as the unique number for the installation location stored at the IC chip 22. For instance, with the measurement modules 20 arranged at the first row, the unique numbers are assigned thereto in the sequence of (X1, Y1), (X2, Y1), ..., (Xm, Y1). With the measurement modules 20 arranged at the last row, the unique numbers are assigned thereto in the sequence of (X1, Yn), (X2, Yn), ..., (Xm, Yn).

The IC chip 22 is constructed such that it converts the values of the phase and the amplitude of the frequency signals received at the tester antenna 24 into digital signals, and transmits them via the tester antenna 24.

As the IC chip 22 is currently made with a size of micrometers (μm), it may be mounted on the substrate 21 with a micrometer (μm)-scale size.

The IC chip 22 is constructed such that it combines the measured value from the tester antenna 24 with the unique number in a predetermined sequence to generate a predetermined measurement signal, and transmits it through the tester antenna 24 together with a triggering signal.

The tester antenna 24 is formed with a millimeter (mm)-scaled mini antenna or a micrometer (μm)-scaled ultra-mini antenna such that it can be mounted on a substrate 21 with a very small size.

If the tester antenna 24 is enlarged in size, the size of the measurement module 20 becomes greater. In this case, it is impossible to make the measurement by a minute distance, and accordingly, a correct measurement value cannot be obtained with the conversion of the measured values into far-field range data. Furthermore, if the tester antenna 24 has a large size, it is likely that an error may be made in the measured values due to an impedance variation caused by inter-coupling of the neighboring antennas. Therefore, in order to obtain the correct measurement values, it is necessary to minimize the size of the tester antenna 24.

The measurement controller 30 has a receiver antenna 32 to receive the signals transmitted from the measurement antenna 24. The measurement controller 30 converts the signals received at the receiver antenna 32 so as to display the converted signals on a display device such as a monitor or output them through an output unit such as a printer, and stores the measured values together with the information about the locations of the measurement modules 20.

The values measured at the measurement antenna 24 and transmitted to the measurement controller 30 include the phase and the amplitude of the measurement frequency signals transmitted from the source antenna 2.

Figure 1:
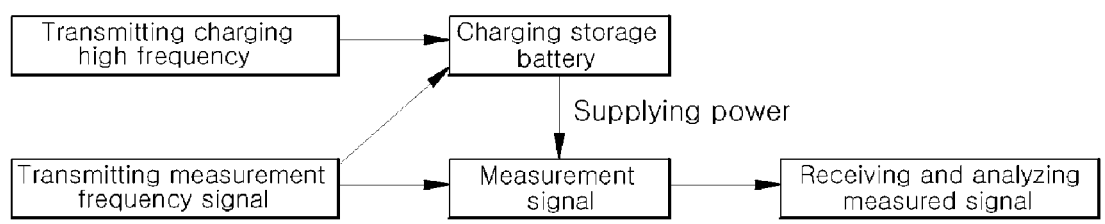
FIG. 1 is a schematic block diagram of a method of measuring the radiation characteristic of an antenna according to an exemplary embodiment of the present invention.

A method of measuring the radiation characteristic of the source antenna 2 by using the above-structured antenna radiation measurement system will be described with reference to FIG. 1 and FIG. 2.

Measurement modules 20 each with an IC chip 22 input with the unique location information, a measurement antenna 24, and a storage battery 28 are first arranged and mounted at predetermined locations of the tester body 10.

When the construction of the tester body 10 is completed, the source antenna 2 is operated while installing the tester body 10 at the predetermined locations (at a distance of 1 wavelength of the frequency transmitted from the source antenna 2).

When the charging high frequency (for instance, the frequency signals range from several hundred megahertz (MHz) to several hundred gigahertz (GHz)) is transmitted with the operation of the source antenna 2, the measurement antenna 24 of the measurement module 20 installed in the tester body 10 receives the charging high frequency signals (the electromagnetic waves) from the source antenna 2, and the DC rectifier 27 converts the received frequency signals (the received electromagnetic waves) into inductive power so as to charge the storage battery 28 therewith.

When the power obtained from the charging high frequency without installing any separate power sources for driving the IC chip 22 is used, the resulting structure is simplified with easy processing as wires for supplying the power are not needed even when a large-sized tester body 10 is constructed, or very large numbers of measurement modules 20 are installed at the tester body 10.

It is also possible to transmit the charging high frequency toward the tester body 10 by installing a separate charging antenna (not shown) without using the source antenna 2.

When the storage battery 28 is charged through the a process like the above, it becomes possible to drive the IC chip 22 and transmit the measured signals through the measurement antenna 24 with sufficient intensity.

When the source antenna 2 is operated so as to transmit predetermined measurement frequency signals in all directions, the measurement antennas 24 of the measurement modules 20 installed in the tester body 10 receive the measurement frequency signals (the electromagnetic waves) of the source antenna 2.

The IC chip 22 of the measurement module 20 samples the amplitude or phase of the frequency received from the measurement antenna 24 so as to store and modulate the sample (using PSK and/or FSK modulation, or CDMA modulation).

Even when the measurement antenna 24 receives the measurement frequency signals, some of the signals are converted into inductive power through the DC rectifier 27, and are charged at the storage battery 28. That is, when the frequency signals are received by the measurement antenna 24, it is also possible to always process the rectifying operation through the DC rectifier 27 and the charging operation at the storage battery 28, irrespective of which frequency signals (for instance, the charging high frequency or the measurement frequency signals) are received by the measurement antenna 24.

The measurement controller 30 receives the signals transmitted from the measurement antennas 24 via the receiver antenna 32 so as to data-process the received information about the locations of the respective measurement modules 20 and modulated signals and store the measured values, and outputs them through a display device or a printer.

The measurement controller 30 has predetermined built-in software, which converts the measured values received from the measurement modules into far-field range data so as to output them through a display device or a printer.

After the front side of the source antenna 2 is measured as above, it may be needed to correctly measure the relevant characteristic of a back lobe thereof. In such a case, the measurement should be made once more while rotating the source antenna 2 by 180°, or by moving the installation location of the tester body 20 to a location that is symmetrical thereto by 180°. Even in this case, the measurement is made within a short period of time, and the measurement time is significantly reduced.

Although it is described above that the measurement is made through first transmitting the charging high frequency so as to charge the storage battery 28 and then transmitting the measurement frequency signals, it is also possible for the charging high frequency and the measurement frequency signals to be transmitted at the same time so as to process the charging of the storage battery 28 and the signal measurement in a simultaneous manner.

If there is a large difference in frequency band between the charging high frequency and the measurement frequency signals, the charging high frequency is filtered by installing a band filter (not shown) at the IC chip 22 such that it is not included in the measurement signals.

If there is only a slight difference in frequency band between the charging high frequency and the measurement frequency signals, even the measurement signals are liable to be partially filtered with the usage of the band filter. For this reason, it is preferable that the storage battery 28 is first charged without using the band filter, and the measurement is made thereafter.

Figure 5:
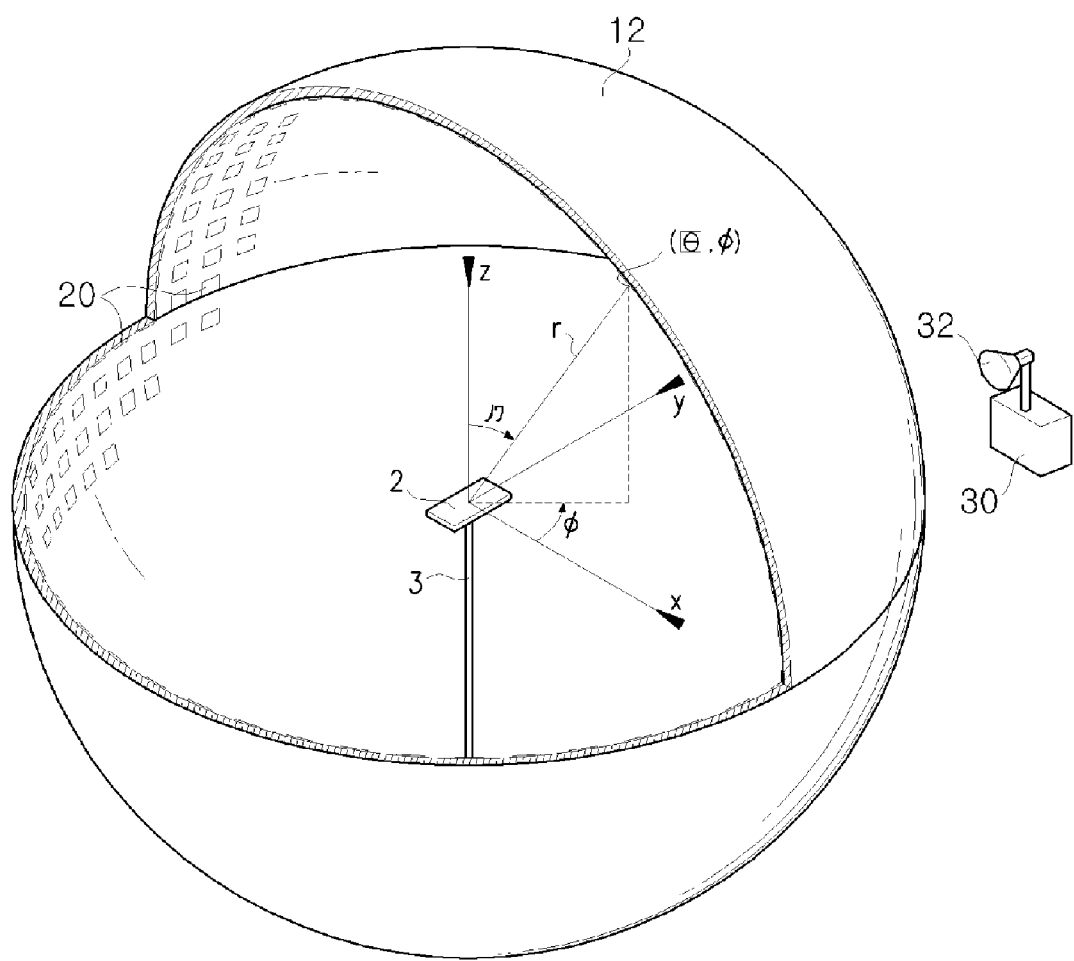
FIG. 5 is a perspective view of another antenna radiation measurement system used in an antenna radiation measurement method according to an exemplary embodiment of the present invention.

As shown in FIG. 5, it is possible for the tester body 12 to be formed in the shape of a sphere, and the measurement modules 20 are arranged within the tester body 12 with a predetermined pattern so as to make the measurement.

It is preferable to use polar coordinates ($\theta$, $\Phi$) based on the angle ($\theta$) of the origin to the z axis and the angle ($\Phi$) thereof to the x axis as the unit number of the installation location stored at the IC chip 22 of the measurement module 20.

If the tester body 12 is spherical-shaped as above, it is preferable in the installation and the replacement of the source antenna 2 to construct the tester body 12 such that it is bisected into an upper hemisphere and a lower hemisphere and combined into a sphere in a separable manner.

The source antenna 2 is fixed to a support 3 installed at the lower hemisphere of the tester body 12. The support 3 is preferably installed at the lower hemisphere such that the source antenna 2 can be positioned at the center of the sphere. It is preferable that the support 3 can move up and down so as to control the height of the source antenna 2.

If the tester body 12 is spherical-shaped as above, it becomes possible to correctly measure the 360° radiation characteristic of the source antenna 2 in all directions with only one measurement.

With the measurement module 20 installed at the tester body 12, the measurement antenna 24 is placed on the plane vertical to the radius (r) being the measurement distance such that it is located vertical to the direction of the electromagnetic waves.

Furthermore, the radius r of the tester body 12 being the measurement distance from the source antenna 2 to the measurement module 20 is established to be larger so as to obtain the far-field range data more precisely.

When the antenna radiation characteristic is measured with respect to the source antenna 2 by using the above-structured system, it is possible to measure the all-directional antenna radiation characteristic within a very short period of time with only the one measurement, to make the effective measurement within a closed indoor space, and to conduct total inspection in the field of production of antennas.

Although it is described above that the tester body 12 is formed in the shape of a sphere, the tester body 12 may be formed with various other shapes like a dome, a hexahedron, a hexahedron with no bottom side, an octahedron, a dodecahedron, an icosahedron, a cone, a quadrangular pyramid, or a horn.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of measuring radiation characteristics of an antenna, comprising:

scanning high frequency for charging, which is in a range from several hundred megahertz (MHz) to several hundred gigahertz (GHz), and transmitted toward a tester body on which a plurality of measurement modules are arranged, each of the plurality of measurement modules comprising a measurement antenna and a storage battery inside each module, such that inductive power is generated to allow self-charging of the storage battery, wherein the tester body processes location information and measured values to transmit measurement signals upon receipt of frequency signals for measurement; and receiving and data-processing, by a measurement controller, the measurement signals transmitted from the measurement antenna of each of the plurality of measurement modules while transmitting the frequency signals for measurement toward the tester body via a source antenna after the storage battery has been self-charged by scanning the high frequency for charging.

* * * * *